(12) United States Patent
Zhang

(10) Patent No.: US 11,082,671 B2
(45) Date of Patent: Aug. 3, 2021

(54) LASER PROJECTION MODULE, DEPTH CAMERA AND ELECTRONIC DEVICE

(71) Applicant: GUANGDONG OPPO MOBILE TELECOMMUNICATIONS CORP., LTD., Guangdong (CN)

(72) Inventor: Xueyong Zhang, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 222 days.

(21) Appl. No.: 16/295,757

(22) Filed: Mar. 7, 2019

(65) Prior Publication Data
US 2019/0281265 A1    Sep. 12, 2019

(30) Foreign Application Priority Data

Mar. 12, 2018    (CN) .......................... 201810201174.2

(51) Int. Cl.
*H04N 9/31*    (2006.01)
*G06T 7/521*    (2017.01)
(Continued)

(52) U.S. Cl.
CPC ........... *H04N 9/3161* (2013.01); *G06T 7/521* (2017.01); *H01S 3/0085* (2013.01);
(Continued)

(58) Field of Classification Search
CPC ...... G06T 7/521; H01S 3/005; H01S 3/09009
See application file for complete search history.

(56) References Cited

U.S. PATENT DOCUMENTS

2002/0071190 A1    6/2002 Wada et al.
2014/0072004 A1    3/2014 Connolly et al.
(Continued)

FOREIGN PATENT DOCUMENTS

CN    102244714    11/2011
CN    102253570    11/2011
(Continued)

OTHER PUBLICATIONS

SIPO, First Office Action for CN Application No. 201810201174, dated Mar. 21, 2019.
(Continued)

*Primary Examiner* — William C. Dowling
(74) *Attorney, Agent, or Firm* — Hodgson Russ LLP

(57) ABSTRACT

A laser projection module, a depth camera and an electronic device are provided. The laser projection module includes a laser emitter, a collimation element, a diffractive optical element and a temperature detection element. The laser emitter is configured to emit laser. The collimation element is arranged in a laser emission direction of the laser emitter and configured to collimate the laser. The diffractive optical element is arranged in a position subsequent to the collimation element along the laser emission direction of the laser emitter, and configured to diffract the laser collimated by the collimation element to form a laser pattern. The temperature detection element is arranged adjacent to the laser emitter and configured to detect a temperature of the laser emitter.

19 Claims, 5 Drawing Sheets

(51) Int. Cl.
    *H01S 3/08*      (2006.01)
    *H01S 3/00*      (2006.01)
    *H01S 3/102*     (2006.01)
    *H01S 5/068*     (2006.01)
    *H01S 5/023*     (2021.01)
    *H01S 5/0233*    (2021.01)
    *H01S 5/0235*    (2021.01)
    *H01S 5/02325*   (2021.01)

(52) U.S. Cl.
    CPC ........ *H01S 3/08009* (2013.01); *H01S 3/1028* (2013.01); *H01S 5/023* (2021.01); *H01S 5/0233* (2021.01); *H01S 5/0235* (2021.01); *H01S 5/06804* (2013.01); *H01S 5/02325* (2021.01)

(56)           References Cited

U.S. PATENT DOCUMENTS

| 2016/0337633 | A1  | 11/2016 | Lee |
| 2017/0131090 | A1  | 5/2017  | Bronstein et al. |
| 2019/0310541 | A1* | 10/2019 | Zhang ................ G02B 27/4272 |
| 2019/0317216 | A1* | 10/2019 | Zhang ..................... G01S 17/48 |
| 2019/0320161 | A1* | 10/2019 | Wei ................... G06K 9/00255 |
| 2020/0004035 | A1* | 1/2020  | Zhang ................ G02B 27/4205 |
| 2020/0004037 | A1* | 1/2020  | Bai .................... G03B 21/2033 |

FOREIGN PATENT DOCUMENTS

| CN | 102401794 | 4/2012 |
| CN | 202562445 | 11/2012 |
| CN | 102955328 | 3/2013 |
| CN | 203387514 | 1/2014 |
| CN | 206149421 | 5/2017 |
| CN | 206412341 | 8/2017 |
| CN | 206470523 | 9/2017 |
| CN | 107357118 | 11/2017 |
| CN | 107609383 | 1/2018 |
| CN | 206877030 | 1/2018 |
| CN | 108344376 | 7/2018 |
| EP | 1689055   | 8/2006 |
| EP | 2363686   | 9/2011 |
| TW | 201108537 | 3/2011 |
| TW | 201140969 | 11/2011 |
| TW | 201347331 | 11/2013 |
| TW | 201428925 | 7/2014 |
| TW | 201738026 | 11/2017 |

OTHER PUBLICATIONS

WIPO, English translation of the ISR and WO for PCT/CN2019/070769, dated Mar. 27, 2019.

EPO, Office Action for EP Application No. 19162315.6, dated Aug. 16, 2019.

TIPO, Office Action for TW Application No. 108108333, dated Sep. 10, 2019.

EPO, Office Action for EP Application No. 19162315.6, dated Jun. 2, 2020.

IPI, Office Action for IN Application No. 201914009465, dated Mar. 16, 2021.

* cited by examiner

LASER PROJECTION MODULE, DEPTH CAMERA AND ELECTRONIC DEVICE

CROSS REFERENCE TO RELATED APPLICATION

This application claims priority to Chinese Patent Application No. 201810201174.2, filed on Mar. 12, 2018, the entire disclosure of which is incorporated herein by reference.

TECHNICAL FIELD

The present disclosure relates to a field of imaging technology, and more particularly, to a laser projection module, a depth camera and an electronic device.

BACKGROUND

The laser emitter generates heat when it is in operation, and an excessive temperature of the laser emitter will cause a high temperature drift thereof, thereby affecting the performance of the laser emitter.

SUMMARY

Embodiments of present disclosure provide a laser projection module, a depth camera and an electronic device.

The laser projection module according to the embodiments of the present disclosure includes a laser emitter, a collimation element, a diffractive optical element and a temperature detection element. The laser emitter is configured to emit laser. The collimation element is arranged in a laser emission direction of the laser emitter and configured to collimate the laser. The diffractive optical element is arranged in a position subsequent to the collimation element along the laser emission direction of the laser emitter, and configured to diffract the laser collimated by the collimation element to form a laser pattern. The temperature detection element is arranged adjacent to the laser emitter and configured to detect a temperature of the laser emitter.

The depth camera according to the embodiments of the present disclosure includes a laser projection module, an image collector and a processor. The laser projection module includes a laser emitter, a collimation element, a diffractive optical element and a temperature detection element. The laser emitter is configured to emit a laser. The collimation element is configured to collimate the laser. The diffractive optical element is configured to diffract the laser collimated by the collimation element to form a laser pattern. The temperature detection element is configured to detect a temperature of the laser emitter and output a temperature detection signal. The image collector is configured to acquire the laser pattern projected by the laser projection module to a target space. The processor is coupled to the temperature detection element, and configured to adjust an emission power of the laser emitter according to the temperature detection signal and to process the laser pattern to obtain a depth image.

The electronic device according to the embodiments of the present disclosure includes a housing and a depth camera. The depth camera is disposed in the housing and configured to be exposed out of the housing to acquire a depth image. The depth camera includes a laser projection module, an image collector and a processor. The laser projection module includes a laser emitter, a collimation element, a diffractive optical element and a temperature detection element. The laser emitter is configured to emit laser. The collimation element is configured to collimate the laser. The diffractive optical element is configured to diffract the laser collimated by the collimation element to form a laser pattern. The temperature detection element is configured to detect a temperature of the laser emitter and output a temperature detection signal. The image collector is configured to acquire the laser pattern projected by the laser projection module to a target space. The processor is coupled to the temperature detection element, and configured to adjust an emission power of the laser emitter according to the temperature detection signal and to process the laser pattern to obtain a depth image.

Additional aspects and advantages of embodiments of the present disclosure will be given in part in the following descriptions, become apparent in part from the following descriptions, or be learned from the practice of the embodiments of the present disclosure.

BRIEF DESCRIPTION OF THE DRAWING

The above and/or additional aspects and advantages of embodiments of the present disclosure will become apparent and more readily appreciated from the following descriptions made with reference to the drawings.

DETAILED DESCRIPTION

Figure 1:
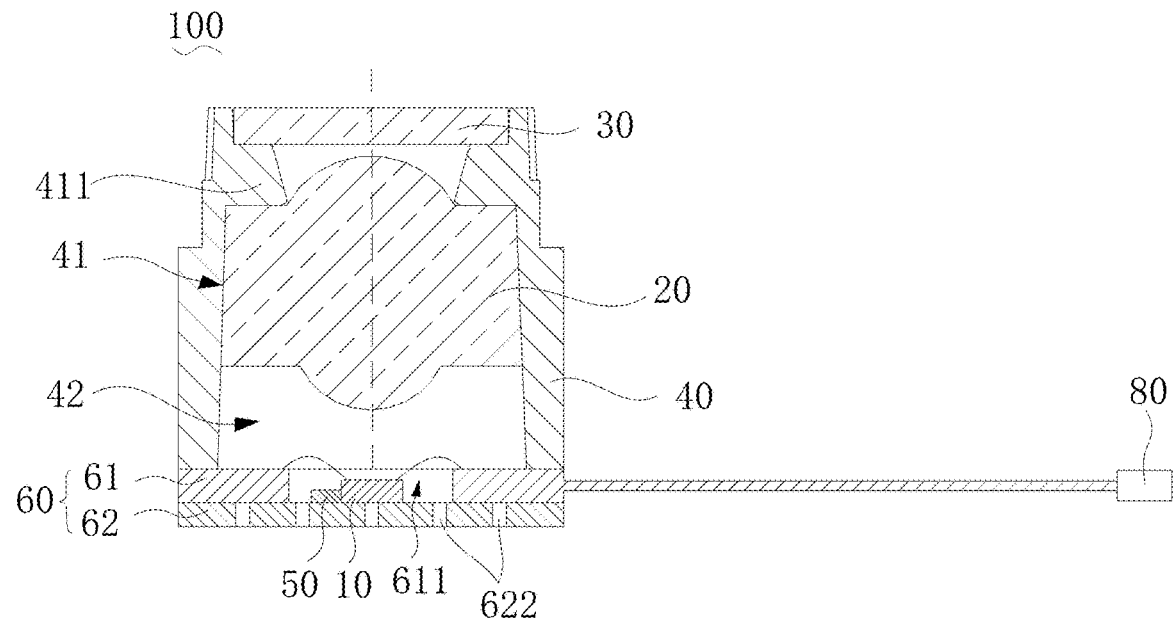
FIG. 1 to FIG. 4 are schematic views illustrating a laser projection module according to some embodiments of the present disclosure.

Embodiments of the present disclosure will be described in detail and examples of the embodiments will be illustrated in the accompanying drawings. The same or similar elements and the elements having same or similar functions are denoted by like reference numerals throughout the descriptions. The embodiments described herein with reference to the drawings are explanatory, which aim to illustrate the present disclosure, but shall not be construed to limit the present disclosure.

In addition, terms such as "first" and "second" are used herein for purposes of description and are not intended to indicate or imply relative importance or significance. Thus, the feature defined with "first" and "second" may comprise one or more this feature. In the description of the present disclosure, "a plurality of" means two or more than two, unless specified otherwise.

In the present disclosure, it should be noted that, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals and/or letters may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

As illustrated in FIG. 1, embodiments of the present disclosure provide a laser projection module 100. The laser projection module 100 includes a laser emitter 10, a collimation element 20, a diffractive optical element 30 and a temperature detection element 50. The laser emitter 10 is configured to emit laser. The collimation element 20 is configured to collimate the laser. The diffractive optical element 30 is configured to diffract the laser collimated by the collimation element 20 to form a laser pattern. The temperature detection element 50 is configured to detect a temperature of the laser emitter 10 and output a temperature detection signal.

As illustrated in FIG. 1, in some embodiments, the laser projection module 100 further includes a substrate assembly 60. The substrate assembly 60 includes a substrate 62 and a circuit board 61 carried on the substrate 62. The laser emitter 10 is carried on the substrate assembly 60.

Figure 2:
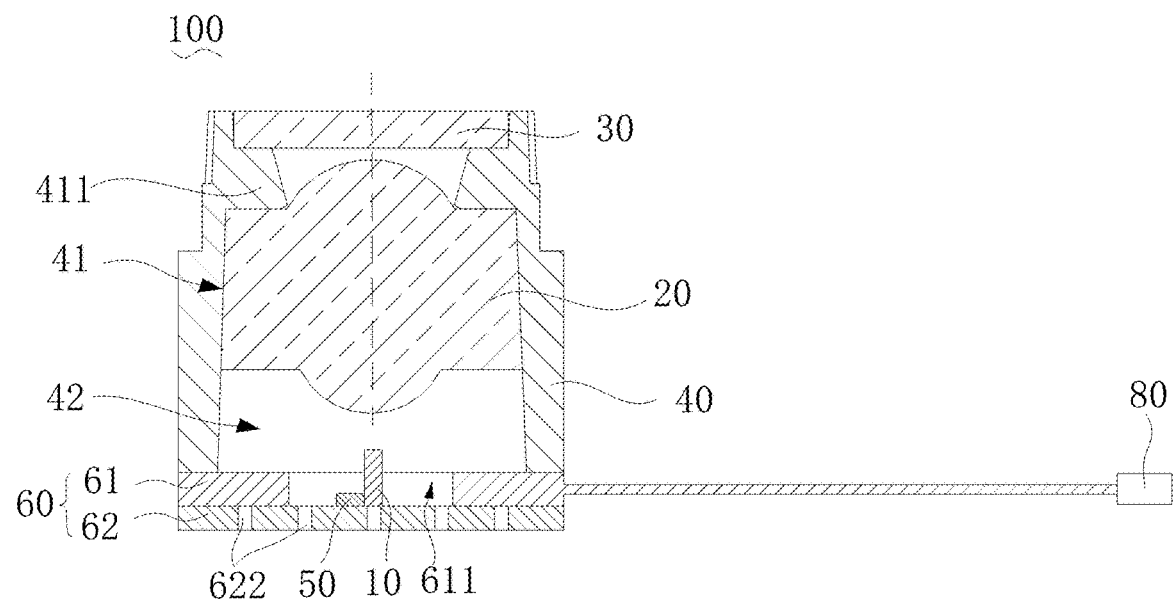

As illustrated in FIGS. 1 and 2, in some embodiments, the circuit board 61 is provided with a via hole 611. Both the laser emitter 10 and the temperature detection element 50 are carried on the substrate 62 and received in the via hole 611.

Figure 3:
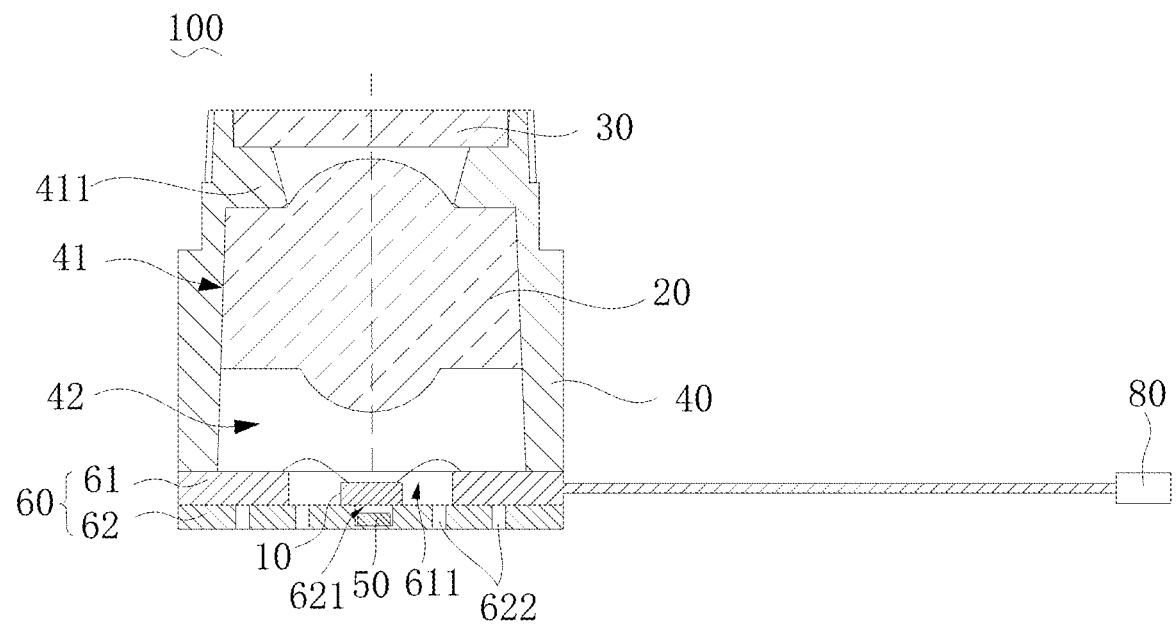
Figure 4:
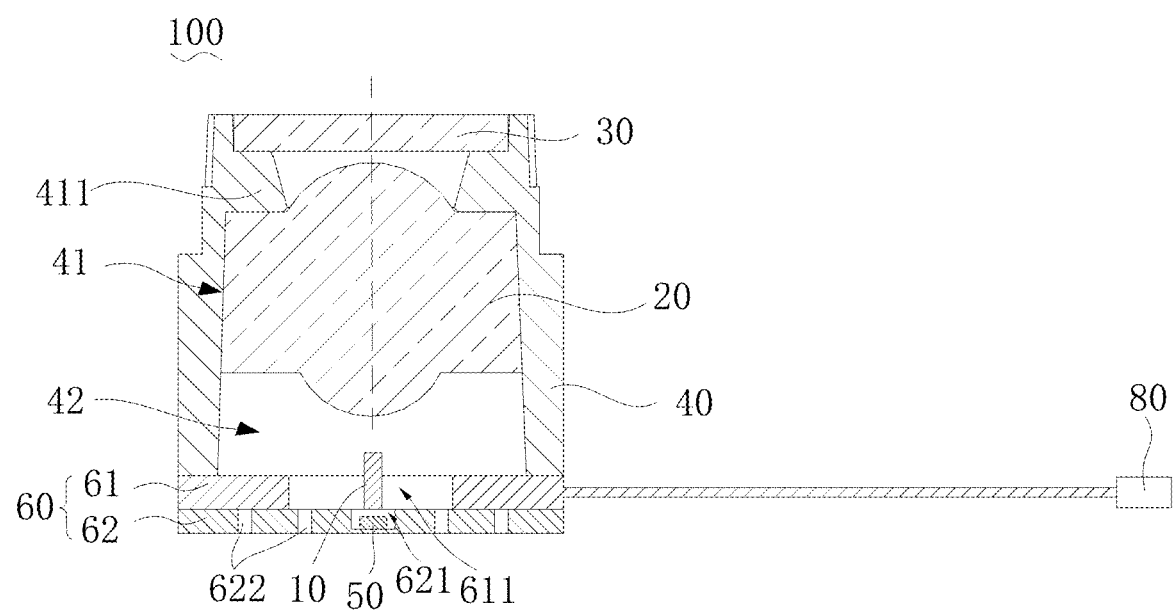

As illustrated in FIGS. 3 and 4, in some embodiments, the circuit board 61 is provided with a via hole 611. The laser emitter 10 is carried on the substrate 62 and received in the via hole 611. The substrate 62 is provided with a through hole 621, and the position of the through hole 621 is opposite to a position where the laser emitter 10 is carried on the substrate 62. The temperature detection element 50 is received in the through hole 621.

In some embodiments, the via hole 611 is aligned with the through hole 621, and the via hole 611 has a larger section area than the through hole 621, such that the laser emitter 10 can be supported on the substrate 62, and also, the temperature detection element 50 can be arranged adjacent to the laser emitter 10, thus facilitating the temperature detection of the laser emitter 10.

Figure 6:
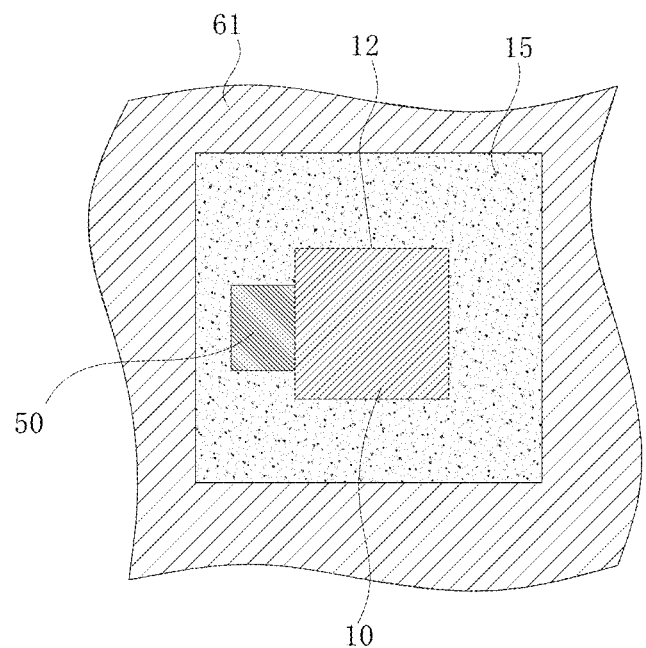

As illustrated in FIGS. 2 and 6, in some embodiments, the laser emitter 10 is an edge-emitting laser. The edge-emitting laser 10 includes a light-emitting surface 11 that faces the collimation element 20.

As illustrated in FIG. 6, in some embodiments, the laser projection module 100 further includes a fixing member. The fixing member is configured to fix the edge-emitting laser to the substrate assembly 60.

As illustrated in FIG. 6, in some embodiments, the fixing member includes a sealant 15 disposed between the edge-emitting laser and the circuit board 61. The sealant 15 is a thermal conductive adhesive.

Figure 7:
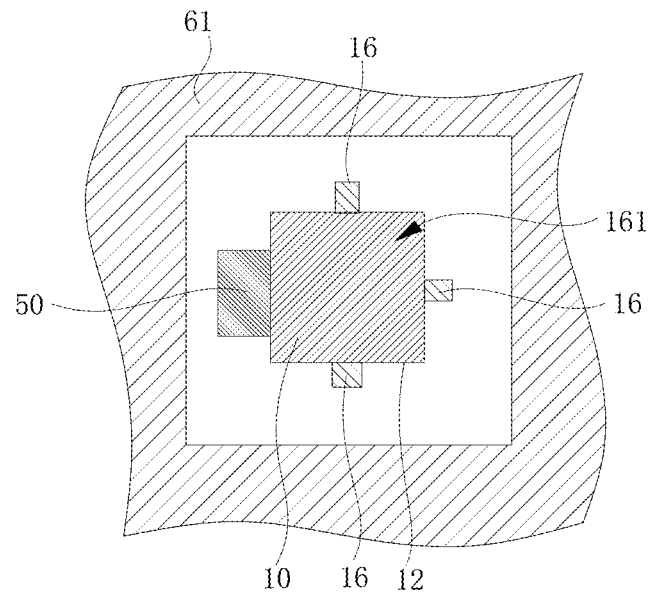

As illustrated in FIG. 7, in some embodiments, the fixing member includes at least two elastic support members 16 disposed on the substrate assembly 60, and the at least two support members 16 together define a receiving chamber. The receiving chamber is configured for receiving the laser emitter 10 therein. The at least two support members 16 are configured to support the laser emitter 10.

Figure 8:
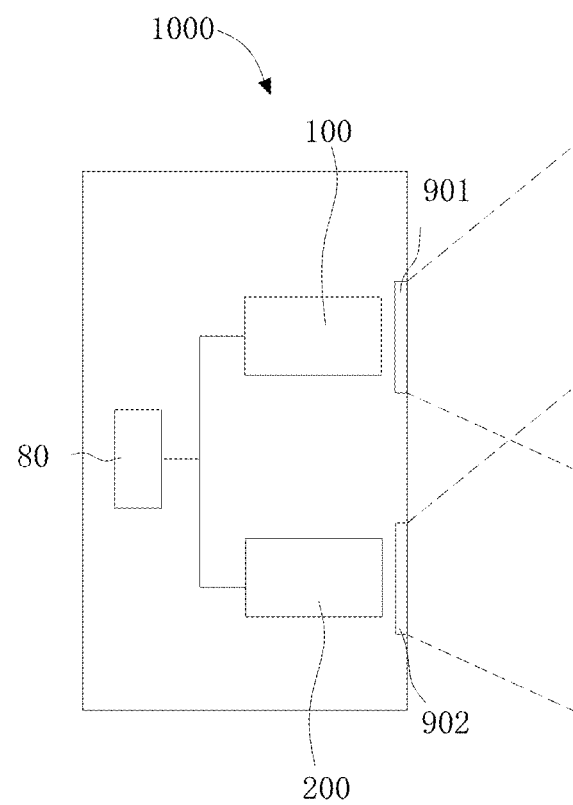
FIG. 8 is a schematic view illustrating a depth camera according to some embodiments of the present disclosure.

As illustrated in FIG. 8, embodiments of the present disclosure also provide a depth camera 1000. The depth camera 1000 includes a laser projection module 100 according to any one of the above embodiments, an image collector 200 and a processor 80. The image collector 200 is configured to capture the laser pattern projected by the laser projection module 100 to a target space. The processor 80 is coupled to the temperature detection element 50. The processor 80 is configured to adjust an emission power of the laser emitter 10 according to the temperature detection signal and to process the laser pattern to obtain a depth image.

Figure 9:
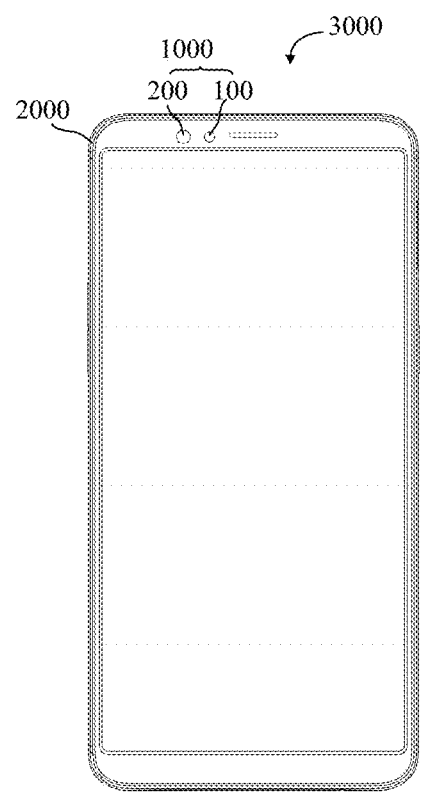
FIG. 9 is a schematic view illustrating an electronic device according to some embodiments of the present disclosure.

As illustrated in FIG. 9, embodiments of the present disclosure further provide an electronic device 3000. The electronic device 3000 includes a housing 2000 and a depth camera 1000 according to the above embodiments. The depth camera 1000 is disposed in the housing 2000 and configured to be exposed out of the housing 2000 to obtain a depth image.

As illustrated in FIG. 1, embodiments of the present disclosure provide a laser projection module 100. The laser projection module 100 includes a lens barrel 40 and a substrate assembly 60. The substrate assembly 60 includes a substrate 62 and a circuit board 61. The circuit board 61 is carried on the substrate 62. The lens barrel 40 includes a side wall 41 and a bearing stage 411 extending from the side wall 41. The side wall 41 is disposed on the circuit board 61, and the side wall 41 and the circuit board 61 together define an accommodating cavity 42. The laser projection module 100 further includes a laser emitter 10, a collimation element 20, a diffractive optical element 30 and a temperature detection element 50. The laser emitter 10, the collimation element 20, the diffractive optical element 30 and the temperature detection element 50 are all received in the accommodating cavity 42, and the collimation element 20 and the diffractive optical element 30 are arranged in sequence along a laser emission direction of the laser emitter 10. In some embodiments, the circuit board 61 is provided with a via hole 611, and the laser emitter 10 is carried on the substrate 62 and received in the via hole 611. The laser emitter 10 is configured to emit laser. The collimation element 20 is configured to collimate the laser emitted by the laser emitter 10. The diffractive optical element 30 is placed on the bearing stage 411 for diffracting the laser collimated by the collimation element 20 to form a laser pattern. The temperature detection element 50 is received in the via hole 611 together with the laser emitter 10, and the temperature detection element 50 may be a thermistor carried on the substrate 62 and placed adjacent to the laser emitter 10. The temperature detection element 50 is configured for detecting a temperature of the laser emitter 10 and outputting a temperature detection signal, and the temperature detection signal may be used as a basis for adjusting the power of the laser emitter 10.

It can be understood that the laser emitter 10 may generate heat when it is in operation, thus causing the temperature of the laser emitter 10 itself to rise. The increase in temperature of the laser emitter 10 will affect the performance of the laser emitter 10. For example, an increase in temperature may cause the laser emitter 10 to produce a temperature drift, that is, a central wavelength of the laser emitter 10 is shifted. Thus, when the laser emitter 10 emits laser at a high temperature, since an optical filtering waveband corresponding to an optical filter of the image collector 200 (illustrated in FIG. 8) used in conjunction with the laser emitter 10 is limited, the temperature drift results in a problem that a portion of the laser emitted by the laser emitter 10, whose wavelength exceeds the optical filtering waveband, cannot be collected by the image collector 200. Therefore, the image collector 200 cannot accurately acquire the laser pattern projected by the laser projection module 100, thereby further affecting acquisition of the depth image.

In the laser projection module 100 according to the embodiments of the present disclosure, the temperature detection element 50 is arranged adjacent to the laser emitter 10, and the temperature detection element 50 can detect the temperature of the laser emitter 10, such that when the temperature of the laser emitter 10 is too high, the power of the laser emitter 10 can be reduced. Thus, the heat generated during the operation of the laser emitter 10 is reduced, the temperature of the laser emitter 10 can be lowered, and further, the problem of affecting the performance of the laser emitter 10 due to the large temperature drift caused by the excessive temperature of the laser emitter 10 can be avoided.

As illustrated in FIG. 1, in some embodiments, the laser emitter 10 may be a vertical cavity surface emitting laser (VCSEL), and the vertical cavity surface emitting laser has a laser emission direction facing the collimation element 20. Since the vertical cavity surface emitting laser has a multi-point light source distributed in an irregular array, the laser patterns projected by the laser projection module 100 have relatively high irrelevance, which benefits improvement of the acquisition accuracy of the depth image.

Figure 5:
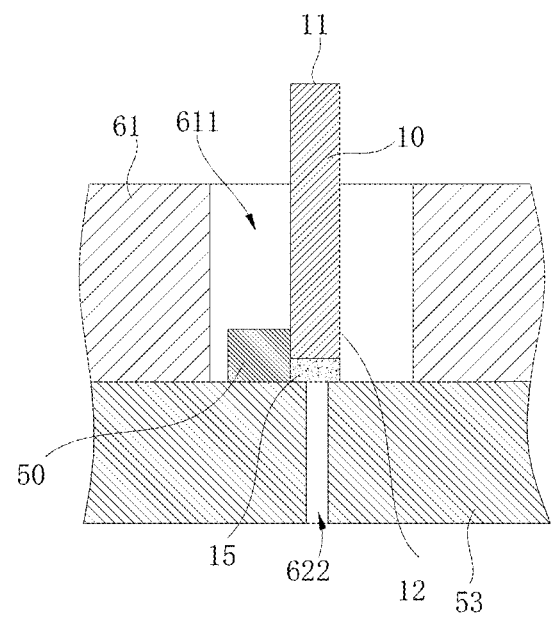
FIG. 5 to FIG. 7 are partial sectional views of a laser projection module according to some embodiments of the present disclosure.

As illustrated in FIG. 2, in some embodiments, the laser emitter 10 may be an edge-emitting laser (EEL). In some embodiments, the laser emitter 10 may be a distributed feedback laser (DFB). In this case, the light-emitting surface 11 of the laser emitter 10 faces the collimation element 20 (as illustrated in FIG. 5). Characterized by a low temperature drift and a single-point light-emitting structure, the distributed feedback laser needs no array structure and can be easily produced, and thus the cost of the laser projection module 100 is low.

As illustrated in FIG. 3 and FIG. 4, in some embodiments, the circuit board 61 is provided with a via hole 611, and the laser emitter 10 is carried on the substrate 62 and received in the via hole 611. The substrate 62 is provided with a through hole 621, and a position of the through hole 621 is opposite to a position where the laser emitter 10 is carried on the substrate 62. The temperature detection element 50 is received in the through hole 621. In this case, the laser emitter 10 may be the vertical cavity surface emitting laser (As illustrated in FIG. 3) or the distributed feedback laser (As illustrated in FIG. 4). Therefore, the temperature detection element 50 is closer to a central light-emitting portion of the laser emitter 10, and can more accurately detect the temperature of the laser emitter 10, so that the power of the laser emitter 10 can be adjusted more timely, and the performance of the laser emitter 10 can be optimized. In addition, when the laser emitter 10 is the distributed feedback laser, since the laser of the distributed feedback laser obtains the power gain through the feedback of the grating structure, the power of the distributed feedback laser needs to be enhanced by increasing the length of the distributed feedback laser. To achieve this, when the distributed feedback laser is arranged vertically (i.e., the light-emitting surface 11 of the distributed feedback laser faces the collimation element 20), the thickness of the laser projection module 100 is relatively large. By providing the via hole 611 in the circuit board 61, and providing the through hole 621 in the substrate 62, the temperature detection element 50 can be received in the through hole 621, and the laser emitter 10 can be partially received in the via hole 611, such that the thickness of the laser projection module 100 can be effectively reduced, and the laser projection module 100 can be integrated into an electronic device 3000 (as illustrated in FIG. 9) such as a smart phone, a tablet computer, a smart watch or a smart wristband.

As illustrated in FIG. 1 to FIG. 4, in some embodiments, the circuit board 61 in the substrate assembly 60 may be a rigid board, a flexible board or a rigid-flex board. The substrate 62 is further provided with a heat dissipation hole 622. The heat generated by the operation of the laser emitter 10 or the circuit board 61 can be dissipated through the heat dissipation hole 622. The heat dissipation hole 622 may also be filled with the thermal conductive adhesive to further improve the heat dissipation performance of the substrate 62. In some embodiments, the temperature detection element 50 and the laser emitter 10 are both carried on the substrate 62, the temperature detection element 50 is received in the via hole 611 and arranged adjacent to the laser emitter 10, and the laser emitter 10 is entirely accommodated in the via hole 611 (i.e., the laser emitter 10 is the vertical cavity surface emitting laser). In this case, a plurality of heat dissipation holes 622 are provided and equidistantly distributed (As illustrated in FIG. 1). Or, the temperature detection element 50 and the laser emitter 10 are both carried on the substrate 62, the temperature detection element 50 is received in the via hole 611 and arranged adjacent to the laser emitter 10, and the laser emitter 10 is partially received in the via hole 611 (i.e., the laser emitter 10 is the edge-emitting laser). In this case, a plurality of heat dissipation holes 622 and provided and equidistantly distributed (As illustrated in FIG. 2). Or, the laser emitter 10 is completely received in the via hole 611 (i.e., the laser emitter 10 is the vertical cavity surface emitting laser), and the temperature detection element 50 is arranged in the through hole 621 of the substrate 62. In this case, a plurality of heat dissipation holes 622 are provided and respectively disposed on both sides of the through hole 621, and the heat dissipation holes 622 located on the same side are evenly distributed (As illustrated in FIG. 3). Or, the laser emitter 10 is partially received in the via hole 611 (i.e., the laser emitter 10 is the edge-emitting laser), and the temperature detection element 50 is arranged in the through hole 621 of the substrate 62. In this case, a plurality of heat dissipation holes 622 are provided and respectively disposed on both sides of the through hole 621, and the heat dissipation holes 622 located on the same side are evenly distributed (As illustrated in FIG. 4).

As illustrated in FIG. 2 and FIG. 5, in some embodiments, the laser emitter 10 is the edge-emitting laser. In this case, the laser projection module 100 further includes a fixing member. In some embodiments, the laser emitter 10 has a columnar shape, and an end surface of the laser emitter 10 facing away from the substrate 62 is configured as a light-emitting surface 11. The laser is emitted from the light-emitting surface 11, and the light-emitting surface 11 faces the collimation element 20. The laser emitter 10 is fixed to the substrate 62. The fixing member is a sealant 15 and the laser emitter 10 is adhered to the substrate 62 by the sealant 15. For example, an end surface of the laser emitter 10 opposite to the light-emitting surface 11 is adhered to the substrate 62. As illustrated in FIG. 1 and FIG. 6, a side surface 12 of the laser emitter 10 extending between the two end surfaces thereof may also be adhered to the substrate 62. The sealant 15 may wrap the surrounding side surfaces 12. Or, the sealant 15 may adhere only one of the side surfaces 12 to the substrate 62 or several of the side surfaces 12 to the substrate 62. In this case, the sealant 15 may be the thermal conductive adhesive to conduct the heat generated by the operation of the laser emitter 10 to the substrate 62. Since the edge-emitting laser generally has a strip shape, when the light-emitting surface 11 of the edge-emitting laser faces the collimation element 20, the edge-emitting laser is arranged vertically. In this case, the edge-emitting laser is prone to accidents such as dropping, shifting, or shaking, and thus the sealant 15 may be provided to fix the edge-emitting laser so as to prevent accidents such as falling, shifting or shaking of the edge-emitting laser.

As illustrated in FIG. 7, in some embodiments, the laser emitter 10 is the edge-emitting laser. In this case, the laser projection module 100 further includes a fixing member. In some embodiments, the laser emitter 10 has a columnar shape, and an end surface of the laser emitter 10 facing away from the substrate 62 is configured as a light-emitting surface 11. The laser is emitted from the light-emitting surface 11, and the light-emitting surface 11 faces the collimation element 20. The laser emitter 10 is fixed to the substrate 62. The fixing member includes an elastic support member 16. Two or more support members 16 may be provided. The support members 16 together define a receiving chamber 161. The receiving chamber 161 is configured for receiving the laser emitter 10 therein, and the support members 16 are configured for supporting the laser emitter 10. In this way, it is possible to prevent the laser emitter 10 from being shaken.

As illustrated in FIG. 8, embodiments of the present disclosure also provide a depth camera 1000. The depth camera 1000 according to the embodiments of the present disclosure includes a laser projection module 100 according to any one of the above embodiments, an image collector 200 and a processor 80. The image collector 200 is configured to collect the laser pattern projected to the target space after being diffracted by the diffractive optical element 30. The processor 80 is coupled to the laser projection module 100, the image collector 200 and the temperature detection element 50, respectively. The processor 80 is configured to adjust the emission power of the laser emitter 10 according to the temperature detection signal, and to process the laser pattern to acquire a depth image.

In some embodiments, the laser projection module 100 projects the laser pattern to the target space through a projection window 901, and the image collector 200 collects the laser pattern modulated by a target object through an acquisition window 902. The image collector 200 may be an infrared camera. The processor 80 calculates a deviation value between each pixel point in the laser pattern and a corresponding pixel point in a reference pattern with an image matching algorithm, and then obtains the depth image of the laser pattern based on the deviation value. The image matching algorithm may be a digital image correlation (DIC) algorithm. Certainly, other image matching algorithms may be adopted to replace the DIC algorithm.

In the laser projection module 100 of the depth camera 1000 according to the embodiments of the present disclosure, the temperature detection element 50 is arranged adjacent to the laser emitter 10, and the temperature detection element 50 may detect the temperature of the laser emitter 10, such that when the temperature of the laser emitter 10 is too high, the power of the laser emitter 10 is reduced, and thus the problem of affecting the performance of the laser emitter 10 due to the large temperature drift caused by the excessive temperature of the laser emitter 10 can be avoided.

As illustrated in FIG. 9, an electronic device 3000 according to embodiments of the present disclosure includes a housing 2000 and a depth camera 1000 according to the above embodiments. The depth camera 1000 is disposed in the housing 2000 and configured to be exposed out of the housing 2000 to obtain a depth image.

In the laser projection module 100 of the electronic device 3000 according to the embodiments of the present disclosure, the temperature detection element 50 is arranged adjacent to the laser emitter 10, and the temperature detection element 50 can detect the temperature of the laser emitter 10, such that when the temperature of the laser emitter 10 is too high, the power of the laser emitter 10 is reduced. Thus, the heat generated during the operation of the laser emitter 10 is reduced, the temperature of the laser emitter 10 can be lowered, and further, the problem of affecting the performance of the laser emitter 10 due to the large temperature drift caused by the excessive temperature of the laser emitter 10 can be avoided.

In the description of the present disclosure, reference throughout this specification to "an embodiment," "some embodiments," "an example," "a specific example," or "some examples," means that a particular feature, structure, material, or characteristic described in connection with the embodiment or example is comprised in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples. Without a contradiction, the different embodiments or examples and the features of the different embodiments or examples can be combined by those skilled in the art.

Although explanatory embodiments have been illustrated and described, it would be appreciated by those skilled in the art that the above embodiments are exemplary and cannot be construed to limit the present disclosure, and changes, modifications, alternatives and varieties can be made in the embodiments by those skilled in the art without departing from scope of the present disclosure.

What is claimed is:

1. A laser projection module, comprising:
a laser emitter configured to emit laser;
a collimation element arranged in a laser emission direction of the laser emitter and configured to collimate the laser;
a diffractive optical element arranged in a position subsequent to the collimation element along the laser emission direction of the laser emitter, and configured to diffract the laser collimated by the collimation element to form a laser pattern; and
a temperature detection element arranged adjacent to the laser emitter and configured to detect a temperature of the laser emitter,
wherein the laser emitter is an edge-emitting laser, and the edge-emitting laser comprises a light-emitting surface facing the collimation element.

2. The laser projection module according to claim 1, wherein the laser projection module further comprises a substrate assembly, the substrate assembly comprises a substrate and a circuit board carried on the substrate, and the laser emitter is carried on the substrate assembly.

3. The laser projection module according to claim 2, wherein the circuit board is provided with a via hole, both the laser emitter and the temperature detection element are carried on the substrate and received in the via hole.

4. The laser projection module according to claim 3, wherein the temperature detection element is configured as a thermistor arranged adjacent to the laser emitter.

5. The laser projection module according to claim 2, wherein the circuit board is provided with a via hole, the laser emitter is carried on the substrate and received in the via hole, the substrate is provided with a through hole, a position of the through hole is opposite to a position where the laser emitter is carried on the substrate, and the temperature detection element is received in the through hole.

6. The laser projection module according to claim 5, wherein the via hole is aligned with the through hole, and the via hole has a larger section area than the through hole.

7. The laser projection module according to claim 2, wherein the laser projection module further comprises a fixing member, and the fixing member is configured to fix the edge-emitting laser to the substrate assembly.

8. The laser projection module according to claim 7, wherein the fixing member comprises a sealant disposed between the edge-emitting laser and the substrate assembly, and the sealant is a thermal conductive adhesive.

9. The laser projection module according to claim 8, wherein the edge-emitting laser comprises:
    a first end surface facing away from the substrate assembly and configured as the light-emitting surface;
    a second end surface opposite to the first end surface; and
    side surfaces extending from the first end surface to the second end surface.

10. The laser projection module according to claim 9, wherein the sealant is disposed between the second end surface of the edge-emitting laser and the substrate assembly.

11. The laser projection module according to claim 9, wherein the sealant wraps at least one of the side surfaces of the edge-emitting laser.

12. The laser projection module according to claim 7, wherein the fixing member comprises at least two elastic support members disposed on the substrate assembly, the at least two support members together define a receiving chamber for receiving the laser emitter therein, and the at least two support members are configured to support the laser emitter.

13. A depth camera, comprising:
    a laser projection module, the laser projection module comprising:
        a laser emitter configured to emit laser;
        a collimation element configured to collimate the laser;
        a diffractive optical element configured to diffract the laser collimated by the collimation element to form a laser pattern; and
        a temperature detection element configured to detect a temperature of the laser emitter and output a temperature detection signal;
    an image collector configured to acquire the laser pattern projected by the laser projection module to a target space; and
    a processor coupled to the temperature detection element, and configured to adjust an emission power of the laser emitter according to the temperature detection signal and to process the laser pattern to obtain a depth image.

14. The depth camera according to claim 13, wherein the laser projection module further comprises a substrate assembly, the substrate assembly comprises a substrate and a circuit board carried on the substrate, and the laser emitter is carried on the substrate assembly.

15. The depth camera according to claim 14, wherein the circuit board is provided with a via hole, both the laser emitter and the temperature detection element are carried on the substrate and received in the via hole.

16. The depth camera according to claim 15, wherein the substrate is provided with a plurality of heat dissipation holes distributed equidistantly.

17. The depth camera according to claim 14, wherein the circuit board is provided with a through hole, the laser emitter is carried on the substrate and received in the via hole, the substrate is provided with a through hole, a position of the through hole is opposite to a position where the laser emitter is carried on the substrate, and the temperature detection element is received in the through hole.

18. The depth camera according to claim 17, wherein the substrate is provided with a plurality of heat dissipation holes disposed on both sides of the through hole respectively, and the heat dissipation holes located on the same side of the through hole are evenly distributed.

19. An electronic device, comprising a housing and a depth camera, the depth camera being disposed in the housing and configured to be exposed out of the housing to acquire a depth image, the depth camera comprising:
    a laser projection module, the laser projection module comprising:
        a laser emitter configured to emit laser;
        a collimation element configured to collimate the laser;
        a diffractive optical element configured to diffract the laser collimated by the collimation element to form a laser pattern; and
        a temperature detection element configured to detect a temperature of the laser emitter and output a temperature detection signal;
    an image collector configured to acquire the laser pattern projected by the laser projection module to a target space; and
    a processor coupled to the temperature detection element, and configured to adjust an emission power of the laser emitter according to the temperature detection signal and to process the laser pattern to obtain a depth image.

* * * * *